(12) United States Patent
Degawa

(10) Patent No.: US 6,215,150 B1
(45) Date of Patent: Apr. 10, 2001

(54) VERTICALLY INTEGRATED SEMICONDUCTOR DEVICE

(75) Inventor: Toshihiko Degawa, Yamatokoriyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/055,214

(22) Filed: Apr. 6, 1998

(30) Foreign Application Priority Data

Apr. 14, 1997 (JP) .................................................... 9-096163

(51) Int. Cl.[7] ............................ H01L 29/76; H01L 29/94; H01L 31/062; H01L 31/113; H01L 31/119

(52) U.S. Cl. ............................ 257/330; 257/331; 257/332; 257/333; 257/343; 257/401

(58) Field of Search ..................................... 257/329, 330, 257/331, 332, 333, 334, 343, 401

(56) References Cited

U.S. PATENT DOCUMENTS

| 4,670,768 | * | 6/1987 | Sunami et al. . | |
| 4,890,144 | * | 12/1989 | Teng et al. . | |
| 5,016,067 | * | 5/1991 | Mori . | |
| 5,122,848 | * | 6/1992 | Lee et al. . | |
| 5,378,914 | * | 1/1995 | Ohzu et al. ........................... | 257/369 |
| 5,627,393 | * | 5/1997 | Hsu ....................................... | 257/331 |
| 5,640,034 | * | 6/1997 | Malhi .................................... | 257/341 |
| 5,682,048 | * | 10/1997 | Shinohara et al. .................... | 257/342 |

FOREIGN PATENT DOCUMENTS

| 1-268172 | 10/1989 | (JP) . |
| 3-253079 | 11/1991 | (JP) . |
| 4-186746 | 7/1992 | (JP) . |
| 5-41521 | 2/1993 | (JP) . |

* cited by examiner

*Primary Examiner*—Ngân V. Ngô
(74) *Attorney, Agent, or Firm*—Nixon & Vanderhye

(57) ABSTRACT

A semiconductor device, which is characterized in that a trench (12) is formed in a silicon substrate (11), an element isolation film (1) is formed on an inner surface of said trench (12), and a drain region (7), a channel region (8) and a source region (9) are arranged vertically in a region encircled by said element isolation film (1); and that a gate insulating film (2) is formed inside of these regions (7, 8 and 9) and a gate electrode (4) is formed on an inner side portion of said gate insulating film (2), while a drain electrode (5) or source electrode (13) is formed on an outer side portion of said gate insulating film (2).

1 Claim, 8 Drawing Sheets

VERTICALLY INTEGRATED SEMICONDUCTOR DEVICE

BACKGROUND OF THE INVENTION

This invention relates to semiconductor device, and in particular, to a vertical MOS semiconductor device where the source, channel and drain thereof are perpendicularly arranged on an SOI substrate. This invention also relates to a method of manufacturing such a vertical MOS semiconductor device.

As a semiconductor device for realizing an increased integration and an increased high speed performance, a MOS semiconductor device which is formed on an SOI (Semiconductor On Insulator) has been known.

FIG. 6 shows a MOS semiconductor device of lateral structure wherein an element substrate (P-type Si) 22 is superimposed via an $SiO_2$ insulating layer 21 on a supporting substrate 20 of P-type Si. A source 23, a channel 24 and a drain 25 are respectively formed in this element substrate 22, and a gate electrode 27 is formed over the channel 24 with a gate insulating layer 26 being interposed therebetween.

FIG. 7 shows a semiconductor device of vertical structure which is disclosed in Japanese Patent Unexamined Publication H/5-41521 and wherein a supporting substrate 28 is superimposed on an element substrate 29 in which a drain 30, a channel 31 and a source 32 are arranged vertically, i.e. in a direction perpendicular to the element substrate 29. A gate electrode 34 is arranged beside these regions 30, 31 and 32 with a gate insulating layer 33 being interposed therebetween. The gate electrode 34, the drain 30, the channel 31 and the source 32 are electrically isolated by an insulating layer 35 formed around them. In this FIG. 7, reference numeral 36 denotes a source wiring, while 37 denotes a gate wiring and 38 denotes a drain wiring.

The SOI structure shown in FIG. 6 is advantageous in the respect of achieving an increased high-speed of performance, since the electric field in the inversion layer is weakened in the direction perpendicular to the surface of substrate, thereby making it possible to enhance the mobility of carriers. However, since the source 23, channel 24 and drain 25 are arranged laterally in this MOS structure, it is accompanied with a problem that the integration degree of elements would be limited.

In the case of the conventional semiconductor device of vertical structure shown in FIG. 7, there are also problems that, since the element substrate 29 is designed to be superimposed on the supporting substrate 28, the manufacturing process thereof becomes complicated thus increasing the manufacturing cost, and at the same time, a parasitic bipolar transistor of P-N-P constituted by the element substrate (P) 29, the supporting substrate (P) 28 and the drain wiring (N) 38 is caused to be formed, in addition to the essential MOS transistor constituted by the source (N) 32, the channel (P) 31 and the drain (N) 30, thus instabilizing the performance of the resultant semiconductor device.

BRIEF SUMMARY OF THE INVENTION

Accordingly, an object of the present invention is to provide a vertical semiconductor device, which makes it possible to enhance the integration degree, to simplify the manufacturing method thereof, and to obtain a stabilized performance.

Another object of the present invention is to provide a method of manufacturing such a vertical semiconductor device.

With a view to achieve the above objects, the present invention provides a semiconductor device, which is characterized in that a drain region, a channel region and a source region are vertically formed in a region of a silicon substrate which is encircles by an element isolation film formed one upon another vertically in the silicon substrate; that a drain (or source) electrode and a gate electrode are lead out from said drain (or source) region to a surface of said silicon substrate; and that said gate electrode is electrically isolated by a gate-insulating film, while said drain (or source) electrode is electrically isolated by an insulating film.

Furthermore, as a specific embodiment of the aforementioned semiconductor device, the semiconductor device is characterized in that the drain electrode, channel electrode and source electrode are arranged such that one of the electrodes is disposed at a center and surrounded dually by the remaining two electrodes. In this embodiment, it is also possible to form element isolation films each radially extending from the electrode disposed at the center to the outermost electrode so as to form a plurality of transistors each partitioned by said element isolation films.

The method of manufacturing the aforementioned semiconductor device according to the present invention is characterized in that said method comprises:

a first step wherein a trench is formed in a silicon substrate, and then an element isolation film is formed on an inner surface of said trench;

a second step wherein a drain region, a channel region and a source region are formed so as to be arranged vertically in a region encircled by said element isolation film;

a third step wherein a trench is formed vertically penetrating into a drain region, a channel region and a source region, and then a gate insulating film is formed on an inner surface of said trench;

a fourth step wherein a gate electrode is formed on an inner side portion of said gate insulating film, while a drain electrode (or source electrode) is formed on an outer side portion of said gate insulating film; and a fifth step wherein an interlayer insulating film is formed between said gate electrode and said drain electrode (or source electrode).

Further, as a specific embodiment of the aforementioned method of manufacturing semiconductor device, the method is characterized in that the second step comprises the steps of:

forming a drain (or source) region by etching said region encircled by the element isolation film at first and then by implanting an impurity in the etched region;

forming a channel region by depositing a non-doped polysilicon in said drain (or source) region at first and then by implanting an impurity in said non-doped polysilicon; and forming a source (or drain) region by depositing a non-doped polysilicon in said channel region at first and then by implanting an impurity in said non-doped polysilicon.

Furthermore, as another specific embodiment of the aforementioned method, the second step may be performed by a process of ion-implantation to be effected from the top of a region of the silicon substrate which is encircled by said element isolation film, thereby forming said drain region, said channel region and said source region.

Additionally, as another specific embodiment of the aforementioned method, the fourth step may be performed by the steps of;

depositing a polysilicon film on the inner side of gate insulating film; and performing a doping of said polysilicon film and of a portion of the silicon substrate which is disposed next to said polysilicon film, thereby forming said gate electrode and drain (or source) electrode.

According to the semiconductor device constructed as mentioned above, since the drain region, channel region and source region are vertically disposed on a silicon substrate, the integration degree of elements can be increased, and at the same time, the generation of parasitic bipolar can be prevented, thus making it possible to realize a stabilized performance.

According to the method of manufacturing a semiconductor device mentioned above, it is possible to obtain a semiconductor device which is high in integration density and stable in performance by a simple process comprising the steps of; forming an element isolation film in a silicon substrate thereby to form a region encircled by the element isolation film;performing an ion-implantation of the region encircled by the element isolation film so as to form a drain region, a channel region and a source region, or performing an impurity implantation of the region encircled by the element isolation film after a non-doped polysilicon is deposited on the region so as to form a channel region and source region (or drain region); forming a trench vertically penetrating into a drain region, a channel region and a source region; and forming a gate insulating film on an inner surface of the trench.

DETAILED DESCRIPTION OF THE INVENTION

This invention will be further explained in detail with reference to the following preferred embodiments.

Figure 1:
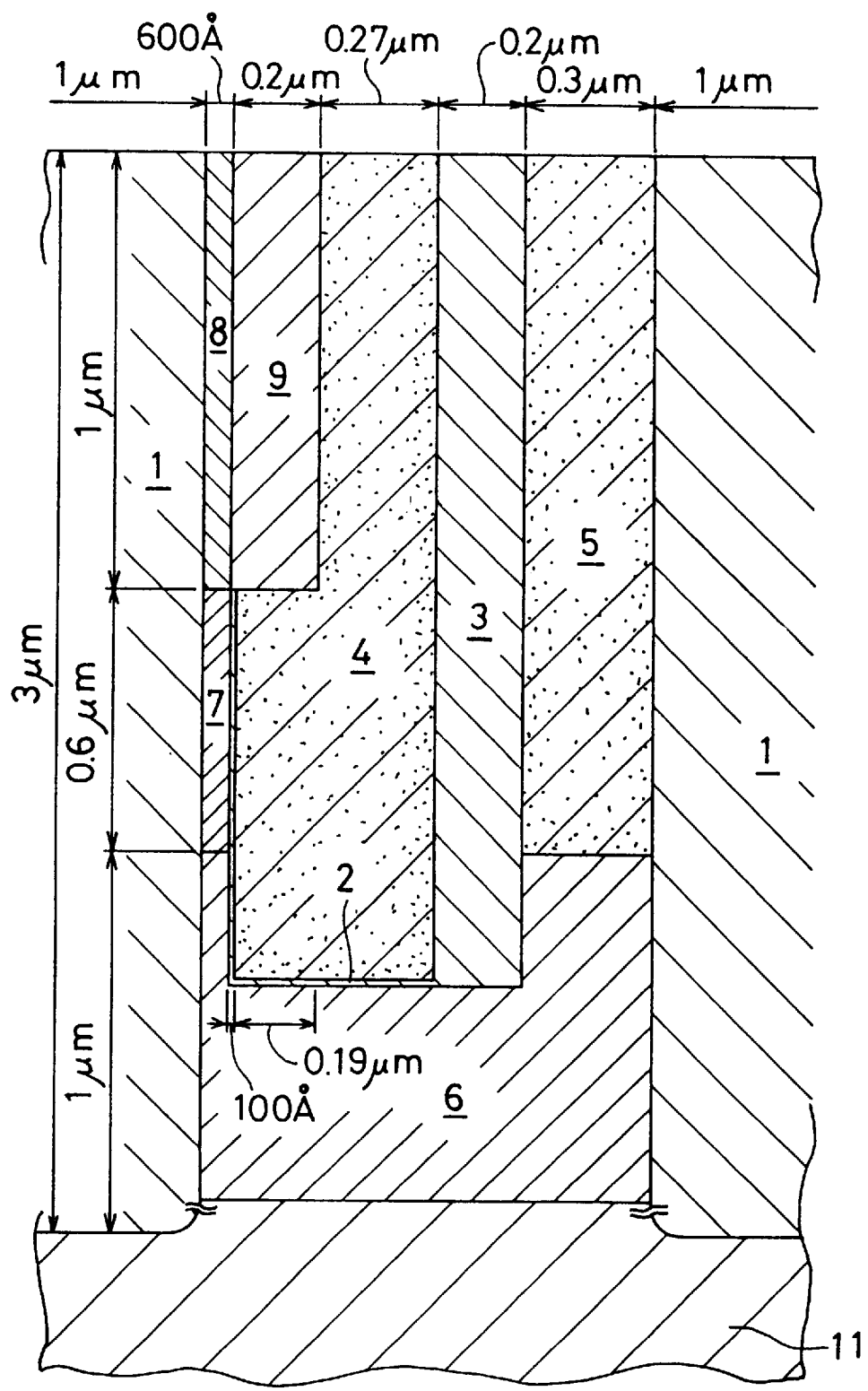
FIG. 1 is a cross-sectional view schematically illustrating the structure of semiconductor device according to a first embodiment of the present invention.

FIG. 1 shows a cross-sectional view of semiconductor device according to a first embodiment of the present invention.

Referring to FIG. 1, a peripheral element isolation film 1 is vertically formed in a silicon substrate 11. A drain region 6, a channel region 7 and a source region 8 are successively formed one upon another in the mentioned order in a region encircled by the element isolation film 1. A drain electrode 5 and a gate electrode 4 are lead out from the drain region 6 to the surface of the silicon substrate 11. An interlayer insulating film 3 is formed between the drain electrode 5 and the gate electrode 4. A source insulating film 9 is formed between the gate electrode 4 and the source region 8. A gate insulating film 2 is formed between the gate electrode 4 and the drain region 6 as well as between the gate electrode 4 and the channel region 7. Lead-out electrodes 401, 501 and 801 are formed on the gate electrode 4, drain electrode 5 and source region 8, respectively (FIG. 2J). A protective film 10 is formed covering all over the surface of the device. As a result, a vertical operation transistor having a vertical P-N-P structure is formed between the element isolation films 1.

A process of manufacturing this semiconductor device according to a first embodiment of this invention will be explained with reference to FIGS. 2A to 2J.

Figure 2A:
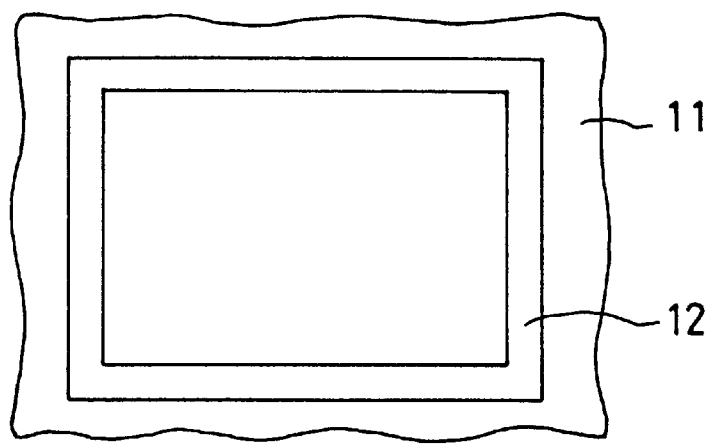
FIGS. 2A to 2J are cross-sectional views illustrating a manufacturing process of the semiconductor device according to a first embodiment of the present invention.

Referring to FIG. 2A, first of all, a square trench 12 is formed in the substrate 11 by means of anisotropic etching such as RIE. This trench 12 may be dimensioned such that 1 µm in width and 3 µm in depth for instance.

Figure 2B:
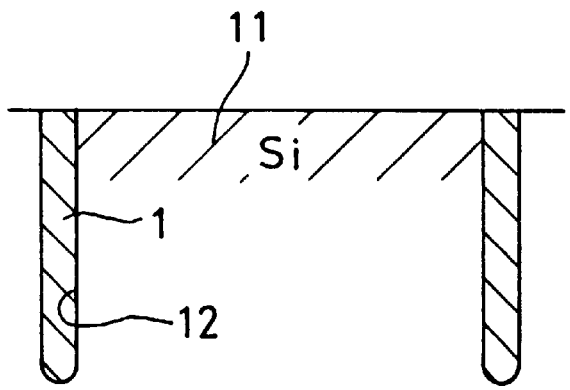

In the step shown in FIG. 2B, an oxide film ($SiO_2$ film) is filled in the trench 12 thereby to form the element isolation film 1.

Figure 2C:
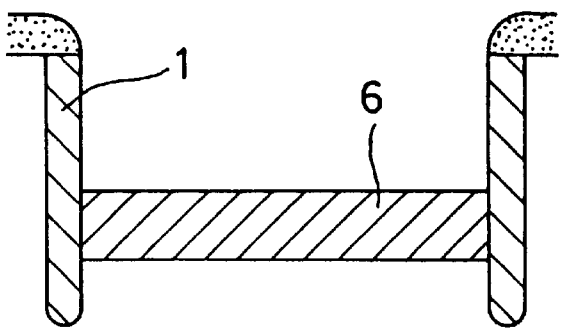

In the step shown in FIG. 2C, a portion of the silicon substrate 11 which is encircled by the element isolation film 1 is etched by means of photolithographic technology, i.e. a plasma etcher to a depth of 1.6 µm. The region thus etched is then subjected to an ion-implantation using a P-type impurity such as boron thereby to form the drain region 6.

Figure 2D:
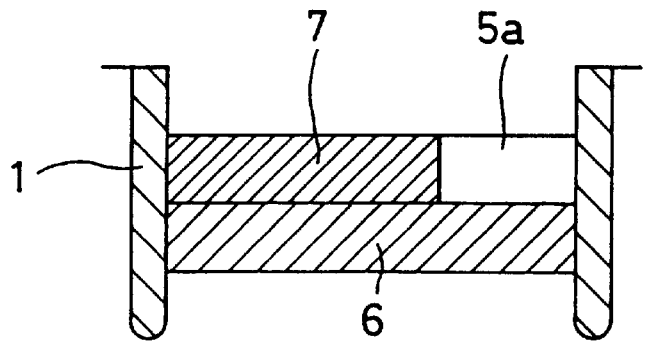

In the step shown in FIG. 2D, a non-doped polysilicon is deposited all over the surface by means of a low pressure CVD method (LPCVD method), and then the resultant non-doped polysilicon layer is etched back so as to leave a non-doped polysilicon layer 0.6 µm in thickness only on the surface of the drain region 6. Then, an ion-implantation (an N-type impurity such as phosphorus) is selectively performed, by making use of patterning, on a region of the polysilicon layer excluding a region 5a (at least 0.5 µm in width) where the drain electrode 5 is to be formed, thereby forming the channel region 7 (600 angstroms).

Figure 2E:
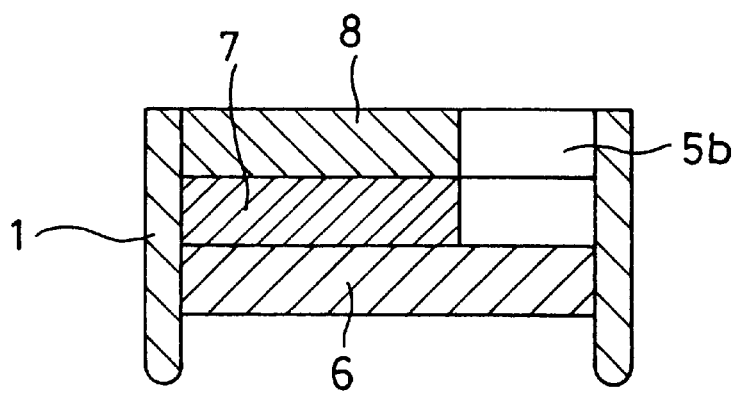

In the step shown in FIG. 2E, a non-doped polysilicon is deposited all over the surface by means of a low pressure CDV method, and then the resultant non-doped polysilicon layer is etched back so as to leave a non-doped polysilicon layer 1 µm in thickness only on the surface of the channel region 7. Then, an ion-implantation (a P-type impurity such as boron) is selectively performed, by making use of patterning, on a region of the polysilicon layer excluding a region 5b (at least 0.5 µm in width) where the drain electrode 5 is to be formed, thereby forming the source region 8.

Figure 2F:
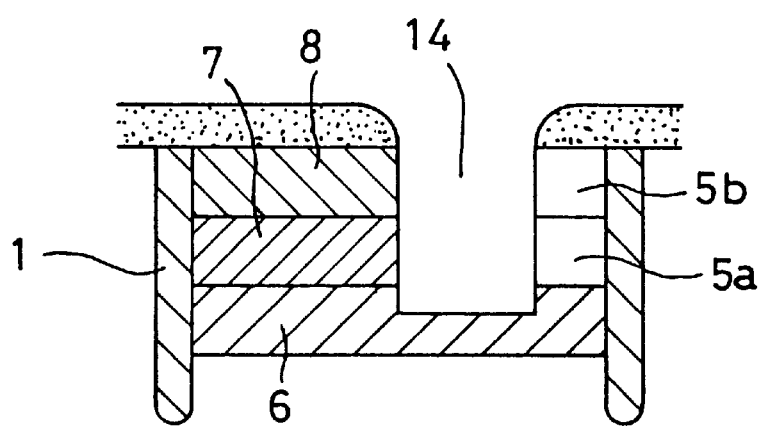

In the step shown in FIG. 2F, a patterned region formed on the source layer 8 and overlapping slightly with the regions 5a and 5b where the drain electrode 5 is to be formed is selectively etched to a depth (1.9 µm) reaching the drain region 6 by making use of an anisotropic etching such as RIE, thereby forming a trench 14 having a width of 0.47 µm.

Figure 2G:
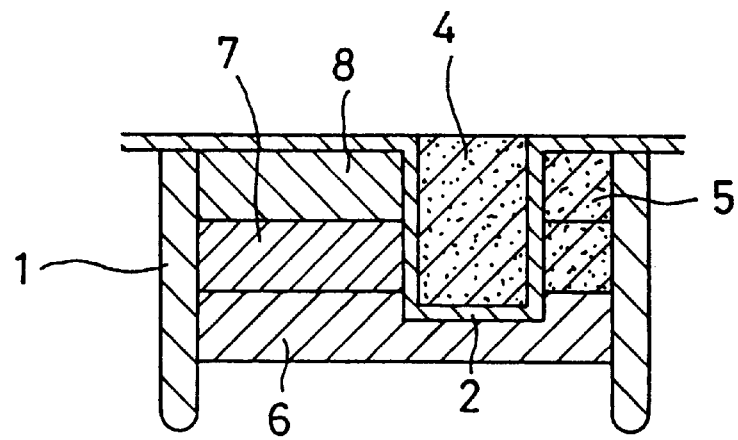

In the step shown in FIG. 2G, a gate oxide film 2 ($SiO_2$ film: 100 angstroms) is formed on the inner wall of the trench 14 which has been formed in the step of FIG. 2F. Then, the space in the trench 14 is buried with polysilicon to be turned into a gate electrode by means of a low pressure CVD method, and the polysilicon thus buried is subjected to an $N^+$ doping, thereby forming the gate electrode 4. In simultaneous with this doping of gate electrode, the non-doped polysilicon of the drain regions 5a and 5b is also subjected to an $N^+$ doping, thereby forming the drain electrode 5.

Figure 2H:
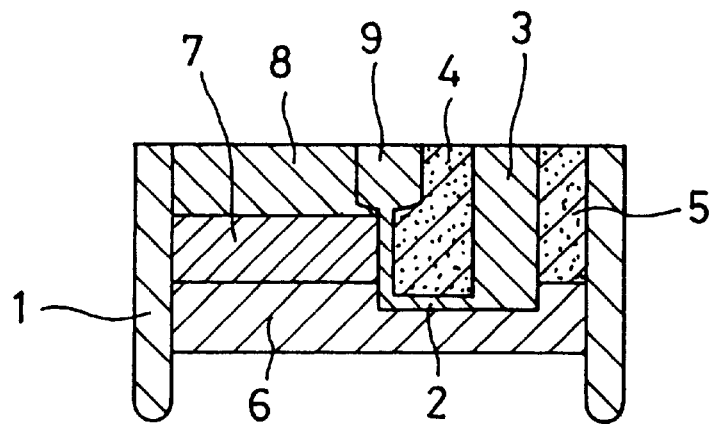

In the step shown in FIG. 2H, by making use of an anisotropic etching such as RIE, a trench having a depth of 1.9 μm and a width of 0.2 μm is formed between the gate electrode 4 and the drain electrode 5, and another trench having a depth of 1 μm and a width of 0.2 μm is formed between the gate electrode 4 and the source electrode 8. Subsequently, an oxide film (a thermal oxide film or an oxide film by means of CVD) is formed on the inner walls of these trenches, thereby forming the interlayer insulating film 3 and the source insulating film 9.

Figure 2I:
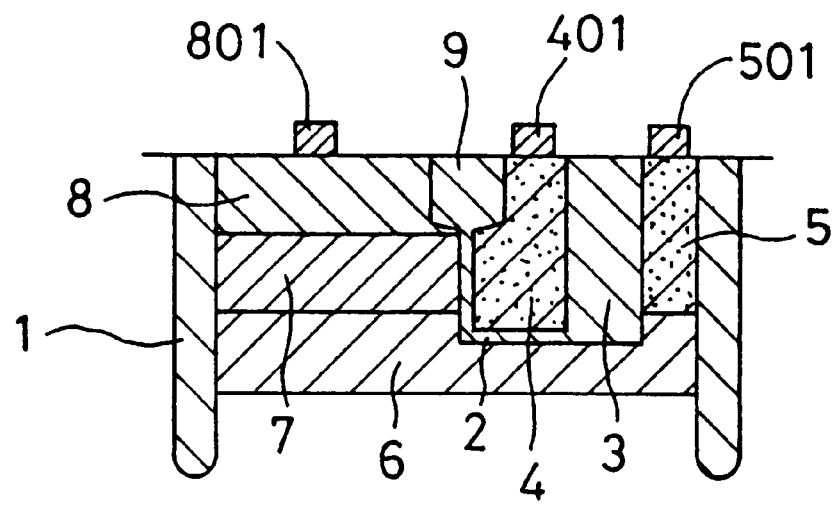
Figure 2J:
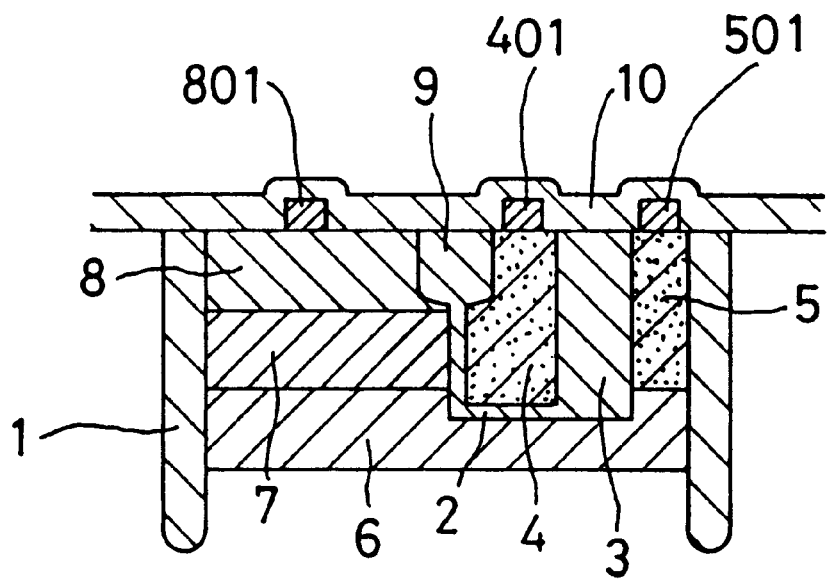

In the step shown in FIG. 2I, an Al—Si is deposited all over the upper surface of the device by means of sputtering and then patterned thereby to form lead-out electrodes 401, 501 and 801 connected with the gate electrode 4, drain electrode 5 and source region 8, respectively.

In the step shown in FIG. 2J, a protective layer 10 is deposited all over the upper surface of the device, thus accomplishing a MOS transistor having a vertical P-N-P structure as shown in FIG. 1. By the way, the specific dimensions described in the above example are only an example, and therefore, the present invention should not be construed as being limited by these specific dimensions.

In the aforementioned process, the drain region 6, the channel 7 and the source region 8 may be formed by making use of only the ion-implantation. In that case, the ion-implantation can be performed directly on the silicon substrate 12 to a desired depth in the step shown in FIG. 2C without performing the etching after the step of photolithography. If the drain region 6, the channel 7 and the source region 8 are formed in this manner, the step of etching as well as the step of depositing polysilicon can be dispensed with, thus making it possible to simplify the manufacturing process.

Figure 3:
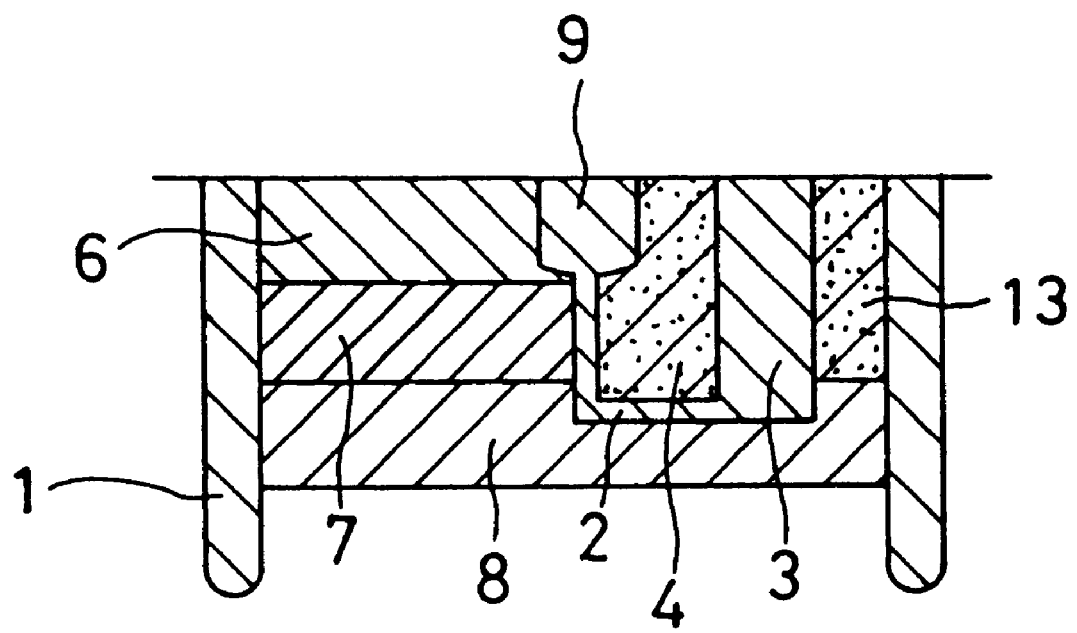
FIG. 3 is a cross-sectional view schematically illustrating the structure of semiconductor device according to a second embodiment of the present invention.

The aforementioned drain region 6 and source region 8 may be reversed in arrangement as shown in FIG. 3 illustrating a second embodiment of the present invention. Namely, in the structure shown in FIG. 3, the drain region 6 and the source region 8 shown in FIG. 1 are exchanged with each other, so that the drain region 6 is disposed at an upper portion and the source region 8 is disposed at a lower portion, thus forming an N-P-N type transistor. By the way, the drain electrode 5 of the aforementioned first example is also substituted by a source electrode 13 in this second embodiment.

Figure 4A:
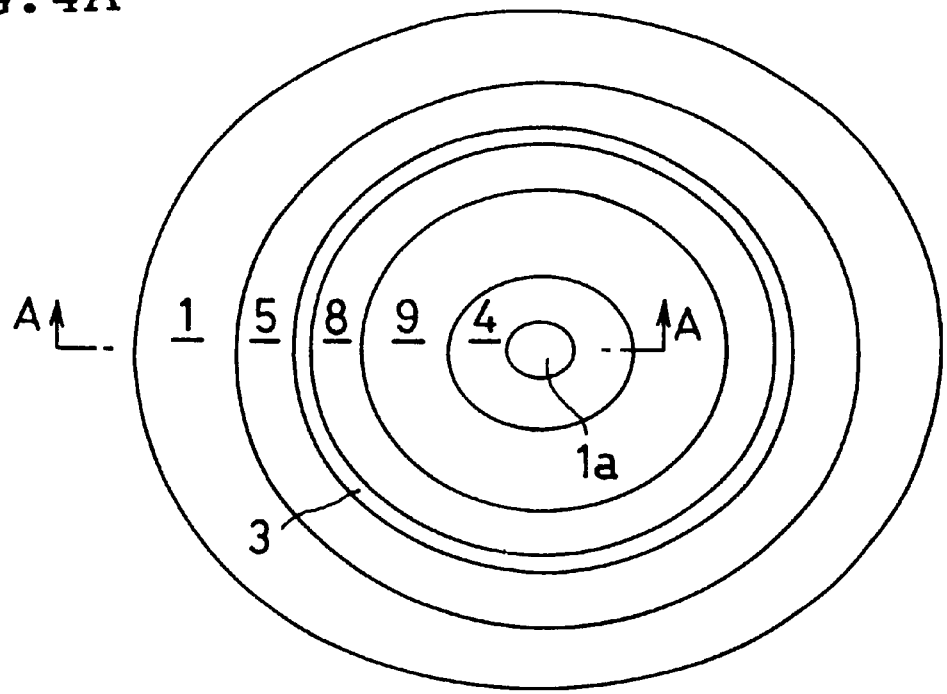
FIGS. 4A and 4B show a plan view and a cross-sectional view taken along the line A—A of FIG. 4A, respectively illustrating the semiconductor device according to a third embodiment of the present invention cross-sectional views.
Figure 4B:
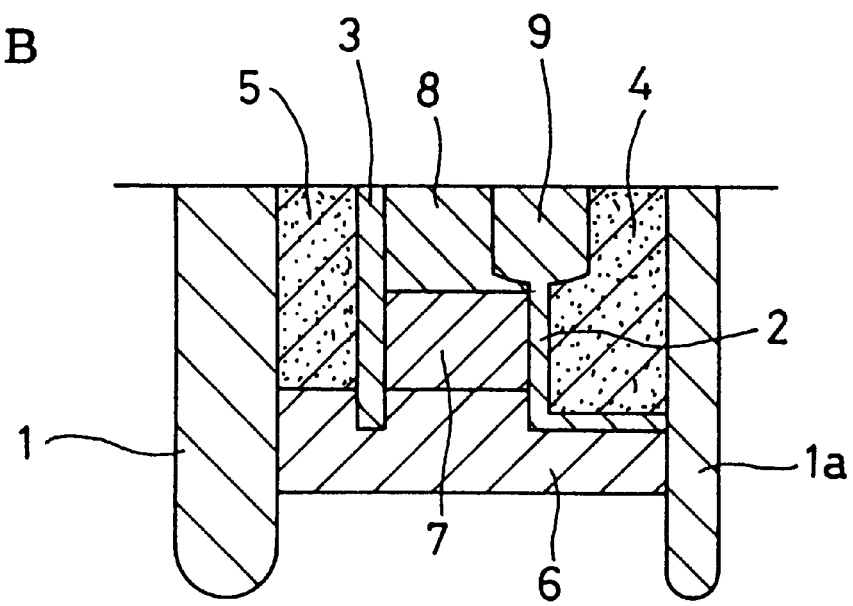

FIGS. 4A and 4B show a semiconductor device according to a third embodiment of the present invention. In this third embodiment, the element isolation film 1 is elliptically formed, and each element is formed within this elliptical region encircled by the element isolation film 1.

As shown in FIGS. 4A and 4B, an element isolation film 1a is disposed at the center, around of which the gate electrode 4 is formed. The gate electrode 4 is surrounded by source insulating film 9 and then by the source region 8, around of which the drain electrode 5 constituting an outermost region is formed with the interlayer insulating film 3 being interposed therebetween. Namely, the drain electrode 5 is disposed along the inner wall of the element isolation film 1. According to this third embodiment, the thickness of the interlayer insulating film 3 can be made thinner, so that the resultant semiconductor chip can be further miniaturized and at the same time, an electrical interference between the drain and gate can be eliminated, thus making it possible to stabilize the performance of semiconductor device.

It is also possible to reverse the arrangement of source region 8 and drain region 6 (i.e., the drain electrode is substituted by the source electrode) in this third embodiment. It is also possible to reverse the arrangement of the drain electrode 5 and the gate electrode 4. Furthermore, the source electrode 13 (see FIG. 3) may be disposed at the center, and the gate electrode 4 and the drain electrode 5 are disposed to surround the source electrode 13. In other words, there is no limitation regarding the arrangement of these electrodes.

Since the transistor is formed around the electrode disposed at the center in this third embodiment, the central element isolation film 1a can be omitted.

Figure 5:
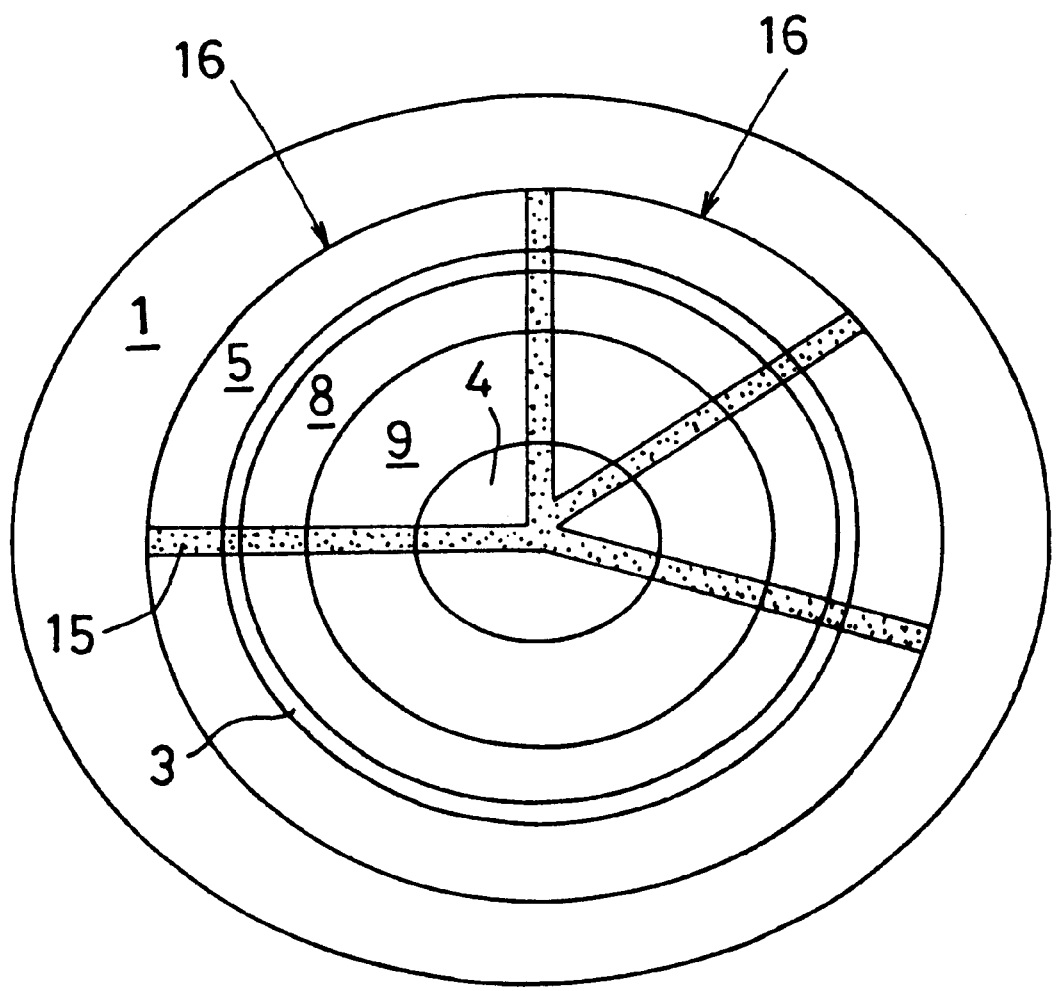
FIG. 5 is a plan view showing the structure of semiconductor device according to a fourth embodiment of the present invention.
Figure 6:
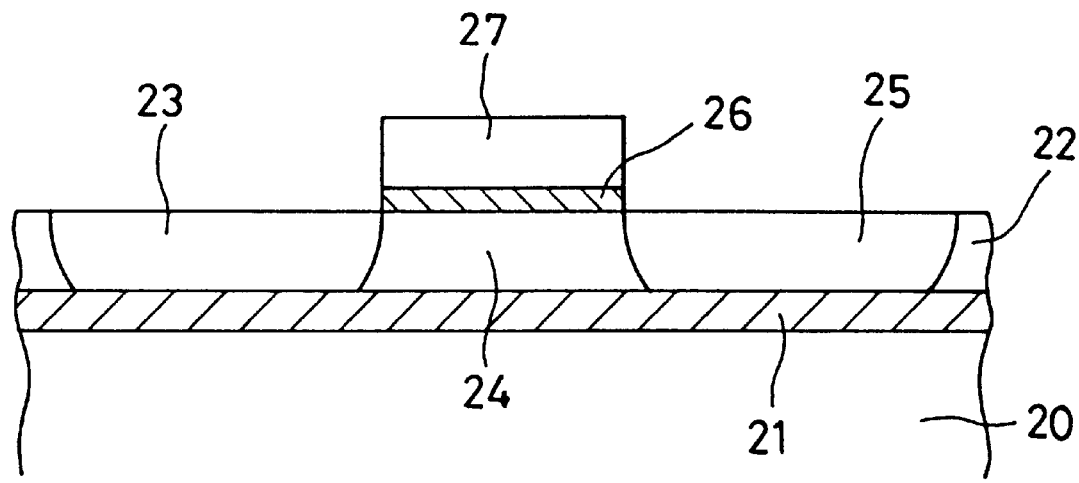
FIG. 6 is a cross-sectional view of a lateral semiconductor device of the prior art.
Figure 7:
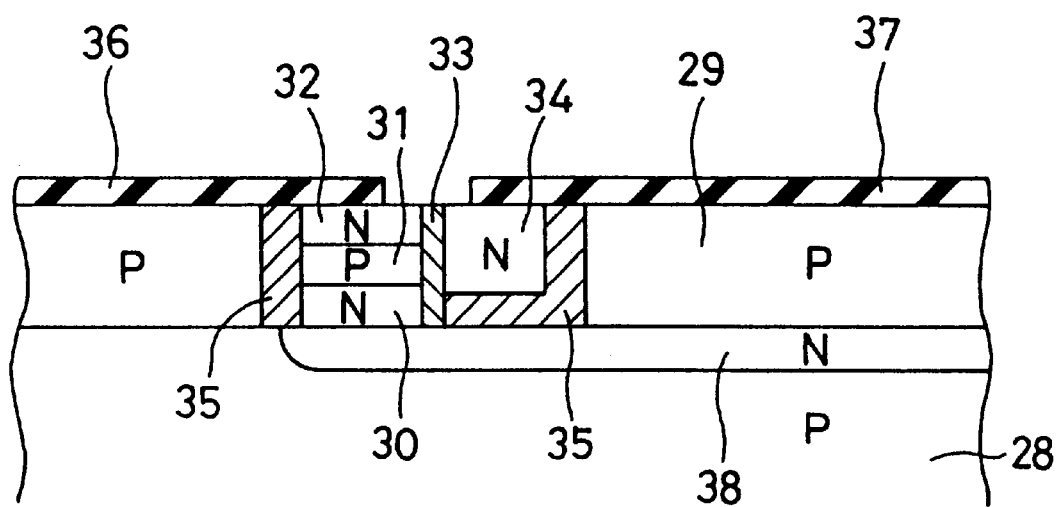
FIG. 7 is a cross-sectional view of a vertical semiconductor device of the prior art.

FIG. 5 shows a semiconductor device according to a fourth embodiment of the present invention.

The semiconductor device according to a fourth embodiment is similar to that shown in FIGS. 4A and 4B except that element isolation films 15, each radially extending from the electrode disposed at the center (the gate electrode 4 in this illustrated embodiment) to the inner wall of the peripheral element isolation film 1, are formed so as to partition the semiconductor device into a plurality of transistors 16 each partitioned by the element isolation films 15.

According to this fourth embodiment, it is possible to form a plurality of transistors in a single semiconductor device of vertical structure. At the same time, a plurality of transistors can be driven simultaneously with a single central gate electrode 4 (or drain electrode or source electrode).

In the third and fourth embodiments, the semiconductor devices are exemplified as having an elliptical structure in plan view. However, the present invention is not limited to the elliptical structure, but the shape of the device may be optionally selected, e.g. it may be circular or polygonal.

In the foregoing explanation, the present invention has been explained with reference to some embodiments. However, the present invention should not be construed to be limited to these embodiments, but may be variously modified within the spirit of the present invention claimed in the claims.

As explained above, it is possible according to the semiconductor device to realize a vertical transistor where a drain region, a channel region and a source region are vertically arranged in high integration degree on a silicon substrate constituting an SOI substrate. Furthermore, since all of the elements can be arranged on a single SOI substrate, the generation of parasitic bipolar can be prevented, thus making it possible to stabilize the performance of the device.

According to the method of manufacturing a semiconductor device mentioned above, a trench is formed in a silicon substrate constituting an SOI substrate at first, and then an element isolation film is formed on the inner wall of the trench, after which a drain region, a channel region and a source region are formed in a region encircled by the element isolation film by making use of ion-implantation or by making use of a process comprising the steps of depositing a non-doped polysilicon and implanting an impurity. Therefore, the conventional step of superimposing an element substrate on a supporting substrate can be dispensed with, thus making it possible to obtain a semiconductor device which is high in integration density and stable in performance by a simple process.

What is claimed is:
1. A semiconductor device comprising a drain region, a channel region and a source region all vertically formed in a region of a silicon substrate which is encircled by an element isolation film formed vertically in the silicon substrate; wherein a drain (or source) electrode and a gate electrode are led out from said drain (or source) region to a surface of said silicon substrate, and wherein said gate electrode is electrically isolated from channel region and said drain by a gate-insulating film, while said drain (or source) electrode is electrically isolated by an interlayer insulating film(s) and wherein the drain electrode, channel electrode and source electrode are arranged such that one of the electrodes is disposed at a center and surrounded by another electrode, and the device includes a plurality of element isolation films, each radially extending from the electrode disposed at the center to an outer electrode so as to form a plurality of transistors each partitioned by said element isolation films.

* * * * *